(12) United States Patent
Hwang et al.

(10) Patent No.: US 9,689,071 B2
(45) Date of Patent: Jun. 27, 2017

(54) GRAPHENE-COATED STEEL SHEET, AND METHOD FOR MANUFACTURING SAME

(75) Inventors: Chan Cuk Hwang, Pohang-si (KR); Yong Gyun Jung, Gwangyang-si (KR); Han Na Hwang, Seoul (KR); Jae In Jeong, Pohang-si (KR); Ji Hoon Yang, Pohang-si (KR)

(73) Assignees: POSCO, Pohang-si (KR); POSTECH ACADEMY-INDUSTRY FOUNDATION, Pohang-si (KR)

( * ) Notice: Subject to any disclaimer, the term of this patent is extended or adjusted under 35 U.S.C. 154(b) by 837 days.

(21) Appl. No.: 13/824,591

(22) PCT Filed: Nov. 9, 2011

(86) PCT No.: PCT/KR2011/008512
§ 371 (c)(1),
(2), (4) Date: Jun. 12, 2013

(87) PCT Pub. No.: WO2012/064102
PCT Pub. Date: May 18, 2012

(65) Prior Publication Data
US 2013/0251998 A1    Sep. 26, 2013

(30) Foreign Application Priority Data

Nov. 9, 2010 (KR) .................. 10-2010-0111153
Nov. 7, 2011 (KR) .................. 10-2011-0115302

(51) Int. Cl.
*B32B 9/00* (2006.01)
*C23C 16/26* (2006.01)
(Continued)

(52) U.S. Cl.
CPC .............. *C23C 16/26* (2013.01); *B82Y 30/00* (2013.01); *B82Y 40/00* (2013.01);
(Continued)

(58) Field of Classification Search
CPC .... C01B 31/04; C01B 31/0423; Y10T 428/30
(Continued)

(56) References Cited

U.S. PATENT DOCUMENTS 7,988,941 B2    8/2011    Choi et al.
8,075,864 B2    12/2011   Choi et al.
(Continued)

FOREIGN PATENT DOCUMENTS

CN    101640275 A    7/2009
JP    2001288625 A   10/2001
(Continued)

OTHER PUBLICATIONS

Trillo (Combined Effects of Deformation (strain and strain state), Grain Size, and Carbon Content on Carbide Precipitation and Corrosion Sensitization in 304 Stainless steel) Materials Characterization 35; p. 99-112 (1995).*

(Continued)

*Primary Examiner* — Daniel H Miller
(74) *Attorney, Agent, or Firm* — The Webb Law Firm (57) ABSTRACT

A graphene-coated steel sheet and a method for manufacturing the same are provided. The graphene-coated steel sheet includes a steel sheet and a graphene layer formed on the steel sheet. Therefore, the graphene-coated steel sheet can be useful in preventing corrosion of iron, such as oxidation of iron, and has remarkably excellent thermal conductivity and electrical conductivity, as well as excellent heat resistance resulting from thermal stability of graphene. Also, the method can be useful in manufacturing a high-quality graphene-coated steel sheet having a monocrystalline form and showing substantially no defects or impurities.

22 Claims, 5 Drawing Sheets

(51) Int. Cl.
*C21D 1/72* (2006.01)
*C21D 8/02* (2006.01)
*C21D 8/04* (2006.01)
*C21D 1/68* (2006.01)
*C21D 3/04* (2006.01)
*C23C 16/48* (2006.01)
*C23C 8/22* (2006.01)
*C23C 14/02* (2006.01)
*C23C 16/02* (2006.01)
*C01B 31/04* (2006.01)
*B82Y 30/00* (2011.01)
*B82Y 40/00* (2011.01)
*C23C 14/06* (2006.01)

(52) U.S. Cl.
CPC ............ *C01B 31/0453* (2013.01); *C21D 1/68* (2013.01); *C21D 1/72* (2013.01); *C21D 3/04* (2013.01); *C21D 8/0284* (2013.01); *C21D 8/0484* (2013.01); *C23C 8/22* (2013.01); *C23C 14/022* (2013.01); *C23C 14/0605* (2013.01); *C23C 16/02* (2013.01); *C23C 16/487* (2013.01); *Y10T 428/30* (2015.01); *Y10T 428/31678* (2015.04)

(58) Field of Classification Search
USPC .......................................... 428/408; 423/448
See application file for complete search history.

(56) References Cited

U.S. PATENT DOCUMENTS

2010/0028749 A1  2/2010  Dadheech et al.
2010/0209330 A1  8/2010  Golzhauser et al.
2010/0218801 A1  9/2010  Sung et al.

FOREIGN PATENT DOCUMENTS

| | | |
|---|---|---|
| JP | 2009091174 A | 4/2009 |
| JP | 2009143799 A | 7/2009 |
| KR | 20090007877 A | 1/2009 |
| KR | 20090026568 A | 3/2009 |
| KR | 20090043418 A | 5/2009 |
| WO | 9714172 | 4/1997 |
| WO | 9714172 A1 | 4/1997 |
| WO | 2010043716 A2 | 4/2010 |

OTHER PUBLICATIONS

Yuan G D et al., "Graphene sheets via microwave chemical vapor deposition", Chemical Physics Letters, Elsevier BV, NL, vol. 467, No. 4-6, Jan. 5, 2009 (Jan. 5, 2009), pp. 361-364.
Lahiri et al., "An extended defect in graphene as a metallic wire", Nature Nanotechnology, Mar. 2010, pp. 326-329, vol. 5.
Li et al., "Graphene Films with Large Domain Size by a Two-Step Chemical Vapor Deposition Process", Nano Letters, American Chemical Society, 2010, pp. 4328-4334, vol. 10.
Loginova et al., "Defects of graphene on Ir(111): Rotational domains and ridges", Physical Review B, The American Physical Society, 2009, pp. 085430-1-085430-8, vol. 80.
Usachov et al., "Experimental and theoretical study of the morphology of commensurate and incommensurate graphene layers on Ni single-crystal surfaces", Physical Review B, The American Physical Society, 2008, pp. 085430-1-085430-8, vol. 78.
Wikipedia, "Full width at half maximum", https://en.wikipedia.org/wiki/Full_width_at_half_maximum, accessed Jul. 26, 2016, pp. 1-3.

* cited by examiner

GRAPHENE-COATED STEEL SHEET, AND METHOD FOR MANUFACTURING SAME

CROSS-REFERENCE TO RELATED APPLICATION

This application claims priority to and the benefit of Korean Patent Applications No. 2010-0111153, filed Nov. 9, 2010, and No. 2011-0115302, filed Nov. 7, 2011, the disclosure of which is incorporated herein by reference in its entirety.

BACKGROUND

1. Field of the Invention

The present invention relates to a steel sheet coated with graphene and a method for manufacturing the same.

2. Discussion of Related Art

To provide a galvanized steel sheet, a zinc alloy-coated steel sheet, an aluminized steel sheet, an aluminum alloy-coated steel sheet, a cold-rolled steel sheet, and a hot-rolled steel sheet, which are used for automobile materials, household appliances, building materials, and the like, with corrosion resistance and plating adhesion, a surface treatment method of coating a chromate coating film has been generally performed. However, as various solutions to working environment and drainage disposal are required due to toxicity of hexavalent chromium, a chromium-free surface-treated steel sheet, which satisfies the characteristic requirements including corrosion resistance, alkali resistance, and conductivity without including hexavalent chromium, has been developed.

However, a surface-treated steel sheet manufactured using a conventional method such as organic or organic/inorganic composite coating should be exposed at a high temperature of 200° C. to 250° C. for a long period of time when it is used for interior/exterior materials of PDP panels. In this case, a change in color and a decrease in physical properties due to deterioration of resin components may be caused with a decrease in thermal stability of an organic material as a coating component.

To solve the problems of the surface-treated steel sheet, a plated steel sheet formed of a silicone-based or fluorine-based resin having excellent heat resistance has been used in the prior art. However, the plated steel sheet which is coated on an underlying layer having a thickness of approximately 5 µm to have a thickness of 20 µm to 30 µm has been widely used to ensure durability, which leads to difficulty in ensuring electric conductivity and an increase in manufacturing cost. For this reason, the plated steel sheet has been restrictedly used for interior/exterior materials to decorate the household appliances. In general, an anti-fingerprint steel sheet having a coating thickness of approximately 1 µm to 2 µm formed on a galvanized steel sheet has been widely used as a surface-treated steel sheet used for interior/exterior materials to decorate the household appliances.

Meanwhile, graphene has come into spotlight as a material whose thermal conductivity is at least 50% more excellent than that of carbon nanotubes. Graphene is a very thin material which has a two-dimensional planar structure in which hexagonal ring structures formed of carbon atoms are arranged periodically and has a thickness corresponding to one carbon atom. Graphene has remarkably excellent thermal stability, and also has thermal conductivity twice higher than diamond, strength 200 times higher than steel, and electrical conductivity in which an electric current 100 times higher than copper may be allowed to flow 50 times faster than silicon. The graphene has come into spotlight as a new next-generation material to replace silicon (Si) due to such excellent characteristics.

Since such graphene has characteristics such as thermal/chemical stability and lubricity, it may substitute a surface treatment solution of a galvanized steel sheet. Therefore, the graphene is probably applicable to the steel industry. More particularly, since electrons in the graphene behave like particles having no rest mass, they move remarkably faster than electrons in a conventional conductor or semiconductor. Since the graphene has significantly high current carrying capacity, it may also be developed as a material having excellent electrical conductivity by coating a metal substrate with graphene. In addition, since the graphene shows higher thermal conductivity than diamond and carbon nanotubes, it may be used as a metallic heat transfer material.

To apply graphene to the steel industry, it is required to grow graphene on a surface of iron which is the most important metal in the steel industry. Up to now, however, there is almost no report concerning a method for growing graphene on a surface of iron.

In the present invention, research on a method for growing graphene on a surface of iron has been conducted. As a result, the present inventor has found a graphene-coated steel sheet and a method for manufacturing the same.

SUMMARY OF THE INVENTION

The present invention is directed to providing a steel sheet coated with graphene and a method for manufacturing the same.

One aspect of the present invention provides a graphene-coated steel sheet including a steel sheet and a graphene layer formed on the steel sheet.

Another aspect of the present invention provides a method for manufacturing a graphene-coated steel sheet. Here, the method includes washing a surface of a steel sheet in a vacuum container with inert gas ions, and forming a graphene layer on the steel sheet by heating the washed steel sheet and injecting hydrocarbon into the vacuum container to dissociatively absorb the hydrocarbon onto the steel sheet.

Still another aspect of the present invention provides a method for manufacturing a graphene-coated steel sheet. Here, the method includes washing a surface of a steel sheet in a vacuum container with inert gas ions and forming a graphene layer on the steel sheet by heating the washed steel sheet to separate carbon included in the steel sheet.

BRIEF DESCRIPTION OF THE DRAWINGS

The above and other objects, features, and advantages of the present invention will become more apparent to those of ordinary skill in the art by describing in detail exemplary embodiments thereof with reference to the attached drawings, in which.

DETAILED DESCRIPTION OF EXEMPLARY EMBODIMENTS

Hereinafter, exemplary embodiments of the present invention will be described in detail. However, the present invention is not limited to the embodiments disclosed below, but can be implemented in various forms. The following embodiments are described in order to enable those of ordinary skill in the art to embody and practice the present invention.

Although the terms first, second, etc. may be used to describe various elements, these elements are not limited by these terms. These terms are only used to distinguish one element from another. For example, a first element could be termed a second element, and, similarly, a second element could be termed a first element, without departing from the scope of exemplary embodiments. The term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

The terminology used herein is for the purpose of describing particular embodiments only and is not intended to be limiting of exemplary embodiments. The singular forms "a," "an," and "the" are intended to include the plural forms as well, unless the context clearly indicates otherwise. It will be further understood that the terms "comprises," "comprising," "includes," and/or "including," when used herein, specify the presence of stated features, integers, steps, operations, elements, components, and/or groups thereof, but do not preclude the presence or addition of one or more other features, integers, steps, operations, elements, components, and/or groups thereof.

With reference to the appended drawings, exemplary embodiments of the present invention will be described in detail below. To aid in understanding the present invention, like numbers refer to like elements throughout the description of the figures, and the description of the same elements will be not reiterated.

The present invention is directed to providing a graphene-coated steel sheet including a steel sheet and a graphene layer formed on the steel sheet.

Hereinafter, the graphene-coated steel sheet according to the present invention will be described in further detail.

The graphene-coated steel sheet according to the present invention includes a steel sheet and a graphene layer formed on the steel sheet, and may satisfy the requirement of the following Expression 1.

$$X \leq 1.5 \text{ eV} \qquad \text{Expression 1}$$

In Expression 1, X represents a full width at half maximum (FWHM) of graphene included in the steel sheet on 1S core level spectra of carbon (C) as measured using a high-resolution photoelectron spectrometer (HRPES).

That is, the graphene-coated steel sheet according to the present invention may have an FWHM of 1.5 eV or less, preferably 1.0 eV or less, more preferably 0.8 eV or less, and most preferably 0.6 eV or less, as observed on the 1S core level spectrum of carbon (C) in graphene measured using a high-resolution photoelectron spectrometer (HRPES).

A lower limit of X is not particularly limited. Here, as X decreases, a graphene-coated steel sheet including high-quality graphene, which serves to prevent corrosion of iron and has remarkably excellent thermal conductivity and electrical conductivity, may be provided. According to the present invention, the lower limit of X may be equal to or greater than 0.2 eV, preferably 0.4 eV, but the present invention is not limited thereto.

According to the present invention, a method for measuring an FWHM of graphene of the graphene-coated steel sheet on the 1S core level spectra of carbon (C) is not particularly limited. For example, the FWHM may be measured using the following method. First, a graphene-coated steel sheet according to the present invention is manufactured and cut into pieces having a size of 7.5 mm×7.5 mm (width×length) to prepare a test sample. Thereafter, photoelectron spectroscopy spectra of carbon (C) in graphene of the test sample are measured using a high-resolution photoelectron spectrometer. Subsequently, the 1S core level spectra of carbon (C) are found from the photoelectron spectroscopy spectra to measure an FWHM of the graphene.

According to the present invention, the term "FWHM" refers to a width of a spectrum curve at a point in which an observed peak reaches half the maximum peak on the 1S core level spectra of carbon (C).

Figure 1:
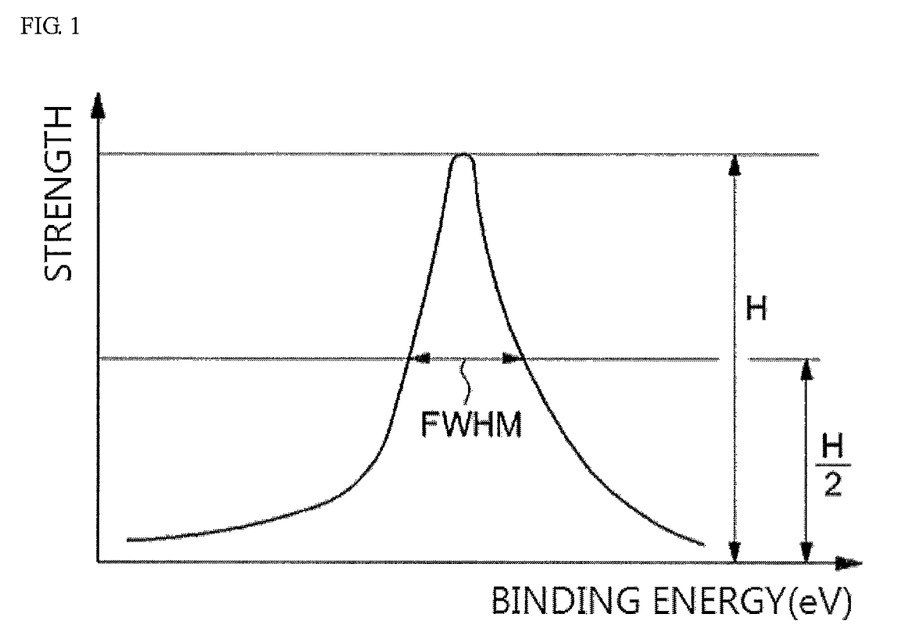
FIG. 1 is a graph illustrating the concept of a full width at half maximum (FWHM)

FIG. 1 is a graph illustrating the concept of an FWHM. As shown in FIG. 1, a graph curve represents the photoelectron spectroscopy spectra, H represents the maximum peak on the 1S core level spectra of carbon (C), H/2 represents a point in which an observed peak reaches half the maximum peak (H), and an FWHM represents a width of the spectrum curve at a point in which an observed peak is half the maximum peak.

According to the present invention, a graphene-coated steel sheet including high-quality graphene, which serves to prevent corrosion of iron and has remarkably excellent thermal conductivity and electrical conductivity, may be provided by controlling an FWHM of the graphene-coated steel sheet on the 1S core level spectra of carbon (C) in graphene to 1.5 eV or less, preferably 1.0 eV or less, more preferably 0.8 eV or less, and most preferably 0.6 eV or less.

Meanwhile, a lower limit of the FWHM is not particularly limited in the present invention. For example, the lower limit of the FWHM is more desirable as it reaches 0 eV. As a value of the FWHM decreases, a graphene may be obtained in a monocrystalline form without showing any of defects or impurities.

According to the present invention, the kind of the steel sheet is not particularly limited. For example, steel sheets widely used in the related art may be used as long as they include an iron (Fe) component.

In the present invention, the graphene layer may be formed in a single-layer or multilayered structure. Depending on a purpose of use of the graphene-coated steel sheet according to the present invention, the graphene layer may be composed of a single layer of graphene or composed of 2 or more multiple layers of graphene.

In the present invention, when the graphene layer is formed in a multilayered structure, the graphene layers may be equal to or less than 10 layers, preferably 9 layers, and more preferably 8 layers. When the graphene layer is controlled up to 10 layers, the graphene-coated steel sheet has a high ability to prevent corrosion of iron and to maintain excellent thermal conductivity and electrical conductivity as well.

According to the present invention, a graphene domain constituting the graphene layer may have two or less dominant domain directions. In the present invention, the dominant directions of the graphene domain may be equal to or less than 2, and preferably 1. Accordingly, an average diameter of the graphene domain may also be enhanced. When the dominant directions of the graphene domain exceed 3, an average diameter of the graphene domain may be reduced.

According to the present invention, a dominant direction of the graphene domain means that the graphene domain aligned in the dominant direction is present at a ratio of 35% or more, preferably 40% or more.

According to the present invention, an average diameter of the graphene domain constituting the graphene layer may be equal to or greater than 200 Å, preferably 300 Å. When the average diameter of the graphene domain is controlled at a diameter of 200 Å or more, an area of the domain boundaries may be reduced to maintain excellent characteristics such as corrosion resistance, thermal conductivity, and electrical conductivity.

An upper limit of the average diameter of the graphene domain is not particularly limited. For example, the upper limit of the average diameter of the graphene domain is more desirable as it increases. As the average diameter of the graphene domain increases, a corrosion preventing effect, thermal conductivity, and electrical conductivity may be enhanced. According to the present invention, an upper limit of the average diameter of the graphene domain may be, for example, controlled up to 2,000 Å, preferably 1,000 Å, but the present invention is not limited thereto.

According to the present invention, the graphene domain constituting the graphene layer may have a monocrystalline or polycrystalline form, preferably a monocrystalline form. When the graphene domain of the present invention has a monocrystalline form, spaces between crystals may be minimized to prevent corrosion of iron and improve thermal conductivity and electrical conductivity.

According to the present invention, carbon (C) remaining in the interface between the steel sheet and the graphene layer may be present at a content of 15 parts by weight or less, preferably 10 parts by weight or less, based on 100 parts by weight of the carbon included in the single graphene layer formed on the steel sheet. When the carbon (C) remaining in the interface between the steel sheet and the graphene layer is controlled at a content of 15 parts by weight or less, qualities of graphene formed on the steel sheet may be improved.

A lower limit of the content of the carbon (C) remaining in the interface between the steel sheet and the graphene layer is not particularly limited. For example, the lower limit of the content of the carbon (C) is more desirable as it reaches 0 parts by weight. As the content of the carbon (C) remaining in the interface between the steel sheet and the graphene layer decreases, a cleanliness level on a surface of the steel sheet may be maintained excellently, thereby improving qualities of graphene to be formed later on the surface of the steel sheet and also preventing corrosion of iron.

The expression "carbon (C) remaining in the interface between a steel sheet and a graphene layer" refers to carbon as impurities remaining on a surface of a steel sheet before a graphene layer is formed on the steel sheet and after the surface of the steel sheet is washed.

According to the present invention, sulfur (S) remaining in the interface between the steel sheet and the graphene layer may be present at a content of 4 parts by weight or less, preferably 2 parts by weight or less, based on 100 parts by weight of the carbon included in the single graphene layer formed on the steel sheet. When the sulfur (S) remaining in the interface between the steel sheet and the graphene layer is controlled at a content of 4 parts by weight or less, qualities of graphene formed on the steel sheet may be improved.

A lower limit of the sulfur (S) remaining in the interface between the steel sheet and the graphene layer is not particularly limited. For example, the lower limit of the content of the sulfur (S) is more desirable as it reaches 0 parts by weight. As the content of the sulfur (S) remaining in the interface between the steel sheet and the graphene layer decreases, a cleanliness level on a surface of the steel sheet may be maintained excellently, thereby improving qualities of graphene to be formed later on the surface of the steel sheet and also preventing corrosion of iron.

The expression "sulfur (S) remaining in the interface between a steel sheet and a graphene layer" refers to sulfur (S) as impurities remaining on a surface of a steel sheet before a graphene layer is formed on the steel sheet and after the surface of the steel sheet is washed.

The present invention is also directed to providing a method for manufacturing a graphene-coated steel sheet. Here, the method includes washing a surface of a steel sheet in a vacuum container with inert gas ions, and forming a graphene layer on the steel sheet by heating the washed steel sheet and injecting hydrocarbon into the vacuum container to dissociatively absorb the hydrocarbon onto the steel sheet.

Hereinafter, the method for manufacturing a graphene-coated steel sheet according to the present invention will be described in further detail.

To manufacture the graphene-coated steel sheet according to the present invention, first, washing a surface of a steel sheet in a vacuum container with inert gas ions may be performed.

According to the present invention, the washing of the surface of the steel sheet may be performed to maintain a clean surface of the steel sheet. To form a graphene layer on the steel sheet, first, a contaminated surface layer of the steel sheet should be removed. This is because a higher-quality graphene layer is formed on a cleaner surface of the steel sheet. From this point of view, the washing of the surface of the steel sheet may be performed in a vacuum container.

The lowest vacuum pressure of the vacuum container used in the present invention may be in a range of $10^{-9}$ Pa to $10^{-6}$ Pa. As used in the present invention, the term "the lowest vacuum pressure" refers to a vacuum pressure in a vacuum container before performing the washing of the surface of the steel sheet. According to the present invention, when the lowest vacuum pressure of the vacuum container is controlled as described above, graphene showing substantially no defects or impurities may be formed on the steel sheet.

In the present invention, gas molecules in the vacuum container may be discharged using a vacuum pump so as to form the lowest vacuum pressure.

The kinds of the vacuum container and the vacuum pump used in the present invention are not particularly limited. For example, vacuum containers and vacuum pumps generally known in the related art may be used without limitation.

In the washing of the surface of the steel sheet according to the present invention, a pressure in the vacuum container may be maintained in a range of $10^{-5}$ Pa to $10^{-2}$ Pa by adding an inert gas.

In the present invention, a very clean surface of the steel sheet may be ensured as described above by providing a vacuum container in which the lowest vacuum pressure is in a range of $10^{-9}$ Pa to $10^{-6}$ Pa, and adding an inert gas to the vacuum container then washing a surface of the steel sheet in a state in which a pressure in the vacuum container is maintained in a range of $10^{-5}$ Pa to $10^{-2}$ Pa. A cleanliness level on the surface of the steel sheet may affect qualities of graphene formed on the surface of the steel sheet.

The washing of the surface of the steel sheet according to the present invention may be performed by repeatedly performing inert gas ion sputtering (Ar ion sputtering) and electron beam heating (e-beam heating) on the surface of the steel. A contaminated layer is formed on the surface of the steel sheet due to oxidation of iron. Here, a physical action may be required to remove the contaminated layer. In the present invention, the contaminated layer may be removed from the surface of the steel sheet by heating the surface of the steel sheet with electron beams and repeatedly giving physical stimuli to the surface-contaminated layer through inert gas ion sputtering.

In the present invention, the kind of the inert gas is not particularly limited. For example, the inert gas may include helium (He), neon (Ne), argon (Ar), krypton (Kr), xenon (Xe), or radon (Rn). Preferably, the inert gas may be argon (Ar).

In the present invention, the heating method using electron beams and the inert gas ion sputtering method are not particularly limited. For example, various methods generally known in the related art may be used herein.

In the present invention, the repeated number of the heating method using electron beams and the inert gas ion sputtering method is not particularly limited. For example, the methods may be repeatedly performed 10 to 200 times, preferably 30 to 150 times, and more preferably 50 to 100 times. When the repeated number of the methods is controlled within this range, a cleanliness level on the surface of the steel sheet may be improved to form a high-quality graphene layer on the steel sheet and maintain excellent manufacturing efficiency of the graphene-coated steel sheet.

According to the present invention, carbon (C) remaining on a surface of the washed steel sheet may be present at a content of 15 parts by weight or less, preferably 10 parts by weight or less, based on 100 parts by weight of the carbon included in the single graphene layer formed on the steel sheet. When the carbon (C) remaining on the surface of the washed steel sheet is controlled at a content of 15 parts by weight or less, qualities of graphene formed on the steel sheet may be improved.

A lower limit of the content of the carbon (C) remaining on the surface of the washed steel sheet is not particularly limited. For example, the lower limit of the content of the carbon (C) is more desirable as it reaches 0 parts by weight.

As the content of the carbon (C) remaining on the surface of the washed steel sheet decreases, a cleanliness level on a surface of the steel sheet may be maintained excellently, thereby improving qualities of graphene to be formed later on the surface of the steel sheet and also preventing corrosion of iron.

According to the present invention, sulfur (S) remaining on a surface of the washed steel sheet may be present at a content of 4 parts by weight or less, preferably 2 parts by weight or less, based on 100 parts by weight of the carbon included in the single graphene layer formed on the steel sheet. When the sulfur (S) remaining on the surface of the washed steel sheet is controlled at a content of 4 parts by weight or less, qualities of graphene formed on the steel sheet may be improved.

A lower limit of the content of the sulfur (S) remaining on the surface of the washed steel sheet is not particularly limited. For example, the lower limit of the content of the sulfur (S) is more desirable as it reaches 0 parts by weight. As the content of the sulfur (S) remaining on the surface of the washed steel sheet decreases, a cleanliness level on a surface of the steel sheet may be maintained excellently, thereby improving qualities of graphene to be formed later on the surface of the steel sheet and also preventing corrosion of iron.

According to the present invention, the formation of the graphene on the steel sheet may be performed by heating the washed steel sheet, and injecting hydrocarbon into a vacuum container to dissociatively absorb the hydrocarbon onto the steel sheet.

According to the present invention, the washed steel sheet may be heated at a temperature of 400° C. to 1,100° C., preferably 500° C. to 900° C., and more preferably 600° C. to 700° C. When the heating temperature of the steel sheet is controlled with in this temperature range, crystallinity of the surface of the steel sheet and crystallinity of the graphene layer formed on the steel sheet may be maintained excellently, and melting of the surface of the steel sheet or detachment of the graphene layer formed on the steel sheet may be prevented.

In the present invention, a method of heating the washed steel sheet at a high temperature is not particularly limited. For example, various methods generally known in the related art may be used herein.

In the present invention, an amount of the hydrocarbon injected into the vacuum container is not particularly limited, but may be equal to or greater than preferably 10 Langmuirs, and more preferably 50 Langmuirs. When the injected hydrocarbon is controlled at an amount of more than 10 Langmuirs, the graphene layer formed on the steel sheet may increase in thickness.

An upper limit of the amount of the injected hydrocarbon is not particularly limited, but may be equal to or less than 10,000 Langmuirs, preferably 5,000 Langmuirs, in consideration of economic feasibility.

As used in the present invention, the term "Langmuir(s)" refers to a unit of exposure to a surface, which is used in the ultrahigh-vacuum surface physics in which research on gas absorption is conducted. The term "Langmuir" is represented by the product of a gas pressure and an exposure time. Here, it is expressed by "1 Langmuir=$10^{-6}$ torr×1 sec."

In the present invention, the kind of the hydrocarbon is not particularly limited, but may include an alkyne-based hydrocarbon such as acetylene, an alkene-based hydrocarbon such as ethylene, propylene, and butylene, or an alkane-based hydrocarbon such as methane.

In the present invention, a graphene layer may be formed after the hydrocarbon injected into the vacuum container is absorbed onto the washed steel sheet through dissociative absorption. That is, the hydrocarbon is dissociated into carbon and hydrogen atoms on a clean steel sheet. In this case, the hydrogen atoms are detached, but the carbon atoms are absorbed onto an iron surface. Therefore, as recombination between the carbon atoms takes place, a graphene layer may be formed on a surface of the steel sheet.

Figure 2:
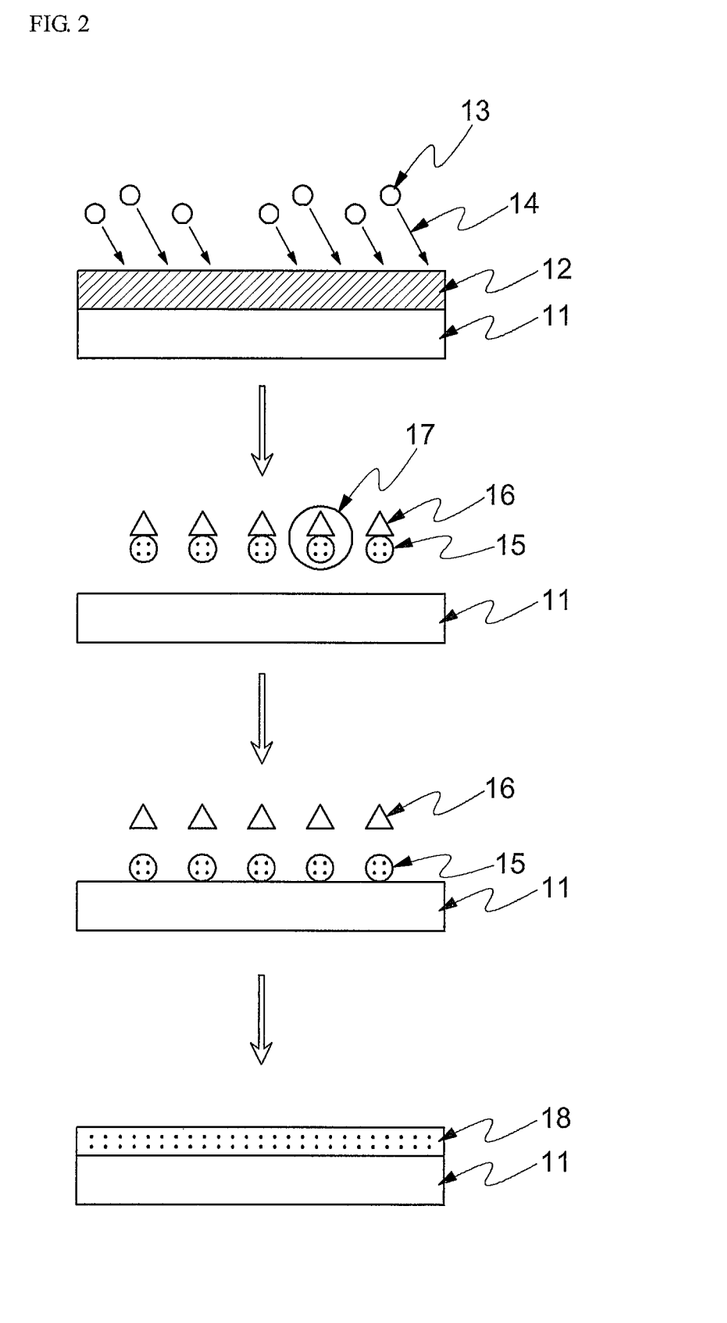
FIG. 2 is a schematic diagram showing a method for manufacturing a graphene-coated steel sheet according to one exemplary embodiment of the present invention.

FIG. 2 is a schematic diagram showing a method for manufacturing a graphene-coated steel sheet according to one exemplary embodiment of the present invention. As shown in FIG. 2, to remove a surface-contaminated layer 12 formed on a clean steel sheet 11, the surface-contaminated layer 12 may be removed from the clean steel sheet 11 by repeatedly performing electron beam heating and inert gas ion sputtering in a vacuum container to allow inert gas ions 13 to continuously collide with the surface-contaminated layer 12 (collision 14). Thereafter, the clean steel sheet 11 may be heated to 400° C. to 1,100° C., and a hydrocarbon 17 composed only of carbon atoms 15 and hydrogen atoms 16 may be injected into the vacuum container to dissociatively absorb the hydrocarbon 17 onto the clean steel sheet 11. Subsequently, a graphene layer 18 may be formed through recombination between the carbon atoms 15 dissociatively absorbed onto the clean steel sheet 11.

Since a high-quality graphene layer having a graphene domain in a monocrystalline form may be formed on a surface of the steel sheet, the graphene-coated steel sheet formed by the manufacturing method may actively prevent corrosion of iron by interfering with contact between iron and oxygen and may exhibit excellent thermal conductivity and electrical conductivity as well.

The present invention is also directed to providing a method for manufacturing a graphene-coated steel sheet. Here, the method includes washing a surface of a steel sheet in a vacuum container with inert gas ions, and forming a graphene layer on the steel sheet by heating the washed steel sheet to separate carbon included in the steel sheet.

Hereinafter, the method for manufacturing a graphene-coated steel sheet according to the present invention will be described in further detail.

To manufacture the graphene-coated steel sheet according to the present invention, first, a surface of the steel sheet in the vacuum container may be washed with inert gas ions.

The washing of the surface of the steel sheet according to the present invention is as described above, and thus description thereof is omitted for clarity.

According to the present invention, carbon (C) remaining on a surface of the washed steel sheet may be present at a content of 15 parts by weight or less, preferably 10 parts by weight or less, based on 100 parts by weight of the carbon included in the single graphene layer formed on the steel sheet. When the carbon (C) remaining on the surface of the washed steel sheet is controlled at a content of 15 parts by weight or less, qualities of graphene formed on the steel sheet may be improved.

A lower limit of the carbon (C) remaining on the surface of the washed steel sheet is not particularly limited. For example, the lower limit of the content of the carbon (C) is more desirable as it reaches 0 parts by weight. As the content of the carbon (C) remaining on the surface of the washed steel sheet decreases, a cleanliness level on a surface of the steel sheet may be maintained excellently, thereby improving qualities of graphene to be formed later on the surface of the steel sheet and also preventing corrosion of iron.

According to the present invention, sulfur (S) remaining on a surface of the washed steel sheet may be present at a content of 4 parts by weight or less, preferably 2 parts by weight or less, based on 100 parts by weight of the carbon included in the single graphene layer formed on the steel sheet. When the sulfur (S) remaining on the surface of the washed steel sheet is controlled at a content of 4 parts by weight or less, qualities of graphene formed on the steel sheet may be improved.

A lower limit of the content of the sulfur (S) remaining on the surface of the washed steel sheet is not particularly limited. For example, the lower limit of the content of the sulfur (S) is more desirable as it reaches 0 parts by weight. As the content of the sulfur (S) remaining on the surface of the washed steel sheet decreases, a cleanliness level on a surface of the steel sheet may be maintained excellently, thereby improving qualities of graphene to be formed later on the surface of the steel sheet and also preventing corrosion of iron.

Next, according to the present invention, graphene may be formed on the steel sheet by heating the washed steel sheet to separate carbon included in the steel sheet.

In the present invention, the washed steel sheet may be heated at a temperature of 400° C. to 1,100° C., preferably 500° C. to 900° C., and more preferably 600° C. to 700° C. When the heating temperature of the steel sheet is controlled with in this temperature range, crystallinity of the surface of the steel sheet and crystallinity of the graphene layer formed on the steel sheet may be maintained excellently, and melting of the surface of the steel sheet or detachment of the graphene layer formed on the steel sheet may be prevented.

According to the present invention, a method of heating the washed steel sheet is not particularly limited. For example, various methods generally known in the related art may be used herein.

According to the present invention, when the steel sheet is heated in the above-described temperature range, both of the carbon (C) component and the sulfur (S) component included in the steel sheet are discharged at the beginning, but the carbon (C) component included in the steel sheet is separated onto a surface of the steel sheet after removal of the sulfur (S) component, thereby forming a graphene layer.

Since a high-quality graphene layer having a graphene domain in a monocrystalline form may be formed on a surface of the steel sheet, the graphene-coated steel sheet formed by the manufacturing method may also actively prevent corrosion of iron by interfering with contact between iron and oxygen and may exhibit excellent thermal conductivity and electrical conductivity as well.

EXAMPLES

Hereinafter, the present invention will be described in further detail with reference to Examples falling within the scope of the present invention and Comparative Examples which do not fall within the scope of the present invention. However, it should be understood that description provided herein is not intended to limit the scope of the present invention.

Example 1

Washing of Contaminated Steel Sheet

Gas molecules were discharged using a vacuum pump so that a pressure in a vacuum container equipped with a voltage applying device and an electron beam irradiation device reached $10^{-8}$ P, and a steel sheet whose surface was contaminated was put in the vacuum container. Then, a small amount of argon gas was injected so that a pressure in the vacuum container reached $10^{-4}$ Pa. Thereafter, an ion generating system was driven to ionize the argon gas. The argon ions were accelerated by a voltage and simultaneously collided against a surface-contaminated layer of the steel sheet. Subsequently, a test sample was irradiated with electron beams to heat a surface of the steel sheet. The above-described procedure was repeatedly performed 50 times to obtain a steel sheet having a clean surface.

Formation of Graphene Layer

The clean steel sheet manufactured as described above was heated at 700° C. by irradiating the steel sheet with electron beams, and acetylene ($C_2H_2$) gas as a hydrocarbon was injected into a vacuum container at an amount of 500 Langmuirs. Thereafter, the acetylene gas was dissociatively absorbed onto the clean steel sheet to form a graphene layer. As a result, a graphene-coated steel sheet coated with a graphene layer having a thickness of 2 Å ($10^{-10}$ m) was manufactured.

Example 2

Washing of Contaminated Steel Sheet

This Example was performed in the same manner as in Example 1 to obtain a clean steel sheet.

Formation of Graphene Layer

The clean steel sheet manufactured as described above was heated at 700° C. by irradiating the steel sheet with electron beams and then maintained at this temperature for 3 minutes. As a result, a sulfur (S) component included in the steel sheet was separated and discharged. Then, as a carbon (C) component was separated, a graphene layer was formed on a surface of the steel sheet. As a result, a graphene-coated steel sheet coated with a graphene layer having a thickness of 2 Å ($10^{-10}$ m) was manufactured.

Comparative Example 1

A graphene-free steel sheet was manufactured in the same manner as in Example 1, except that a graphene layer was not formed.

Experimental Example 1

To check a surface state of the steel sheet formed in each of the operations of the manufacturing method disclosed in Example 1, the steel sheet was measured for photoelectron spectroscopy spectrum, as follows.

An incompletely washed steel sheet (A) obtained by performing electron beam heating and inert gas ion sputtering 10 times, a completely washed steel sheet (B) obtained by performing electron beam heating and inert gas ion sputtering 50 times, and a steel sheet (C) coated with a graphene layer were cut into pieces having a size of 7.5 mm×7.5 mm (width×length), respectively. Then, the photoelectron spectroscopy spectra of the resulting test samples were measured using a high-resolution photoelectron spectrometer (HRPES).

Figure 3:
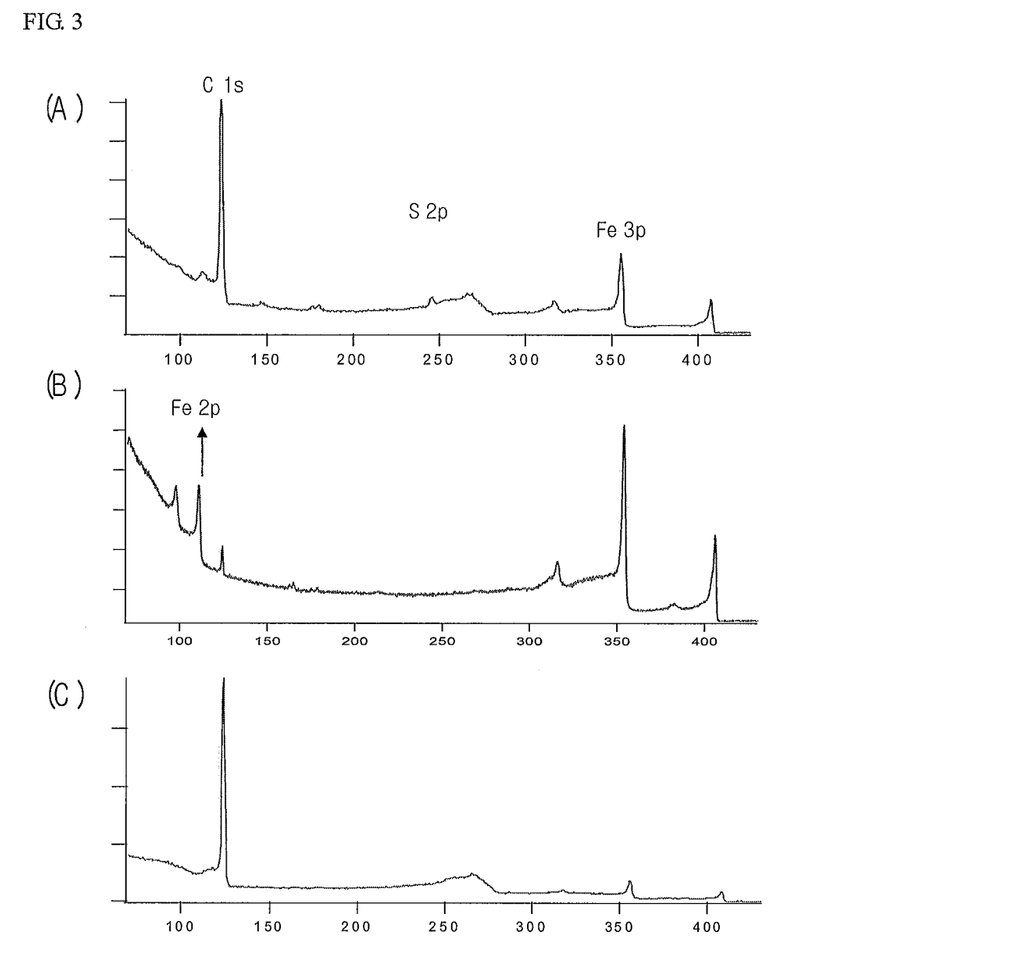
FIG. 3 is a graph illustrating the photoelectron spectroscopy spectra obtained to determine a surface state of a graphene-coated steel sheet manufactured according to one exemplary embodiment of the present invention.

FIG. 3 is a diagram showing the photoelectron spectroscopy spectra of each test sample. FIG. 3(A) shows the photoelectron spectroscopy spectra of a surface of an incompletely washed steel sheet. Here, FIG. 3(B) shows the photoelectron spectroscopy spectra of a surface of a completely washed steel sheet, and FIG. 3(C) shows the photoelectron spectroscopy spectra of a surface of a graphene layer formed on a clean steel sheet. As shown in FIG. 3(A), it could be seen that the impurities such as sulfur (S), carbon (C), and oxygen (O) (not shown) were observed on the surface of the incompletely washed steel sheet, indicating the presence of surface-contaminated layers such as an oxidized layer and an organic material layer. As shown in FIG. 3(B), however, it could be seen that a trace amount of carbon (C) was present on the surface of the completely washed steel sheet, but other impurities were not substantially present on the surface of the completely washed steel sheet, and a peak on the 2P core level spectra of iron (Fe) which was not observed in FIG. 3(A) was clearly observed. As shown in FIG. 3(C), it could be also seen that the peak on the 3P core level spectra of iron (Fe) present on a surface of the graphene layer formed on the clean steel sheet significantly decreased in intensity but the peak on the 1S core level spectra of carbon (C) relatively increased in intensity.

Experimental Example 2

The same test samples (A, B, and C) as used in Experimental Example 1 were measured for low-energy electron diffraction pattern using a low-energy electron diffraction system.

Figure 4:
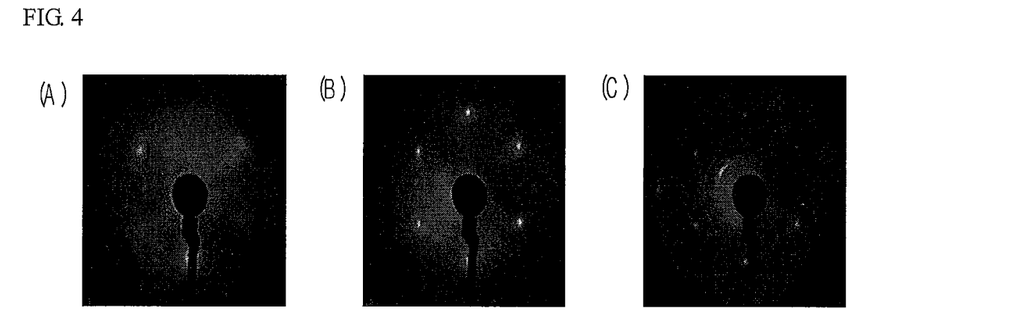
FIG. 4 is an image illustrating the low-energy electron diffraction patterns obtained to determine the surface state of the graphene-coated steel sheet manufactured according to one exemplary embodiment of the present invention.

FIG. 4 is an image illustrating the low-energy electron diffraction patterns of the respective test samples. Here, FIG. 4(A) shows an image of the low-energy electron diffraction pattern of a surface of an incompletely washed steel sheet, FIG. 4(B) shows an image of the low-energy electron diffraction pattern of a surface of a completely washed steel sheet, and FIG. 4(C) shows an image of the low-energy electron diffraction pattern of a graphene layer formed on a surface of a clean steel sheet. As shown in FIG. 4(A), it was revealed that since a large amount of the impurities was present on the surface of the incompletely washed steel sheet, a periodical iron atom structure was not formed on the surface of the steel sheet, thereby showing no clear electron diffraction pattern. As shown in FIG. 4(B), however, it was revealed that an electron diffraction pattern was clearly observed on the surface of the completely washed steel sheet, which indicates that surface atoms are periodically well-aligned over a wide region of the steel sheet; that is, iron is well crystallized. As shown in FIG. 4(C), it was also revealed that an electron diffraction pattern was clearly observed on the surface of the graphene layer formed on the clean steel sheet. The electron diffraction pattern shown in FIG. 4(C) is not a diffraction pattern formed from graphene but a diffraction pattern formed from a surface of the steel sheet, that is, from the interface between the steel sheet and the graphene layer, which indicates that the crystallinity of iron on the surface of the steel sheet is maintained excellently even after the graphene layer grew on the surface of the steel sheet. A graphene domain was too small to observe the diffraction pattern formed from graphene, and the diffraction pattern formed from the graphene was not observed due to destructive interference between the graphene domains.

Experimental Example 3

To determine whether graphene grew on the steel sheet, band images of the graphene-coated steel sheets manufactured in Examples 1 and 2 were took, as follows.

Each of the graphene-coated steel sheets manufactured in Examples 1 and 2 was cut into pieces having a size of 7.5 mm×7.5 mm (width×length). Then, a band image of each test sample was taken by an angle-resolved photoelectron spectrometer (ARPES).

Figure 5:
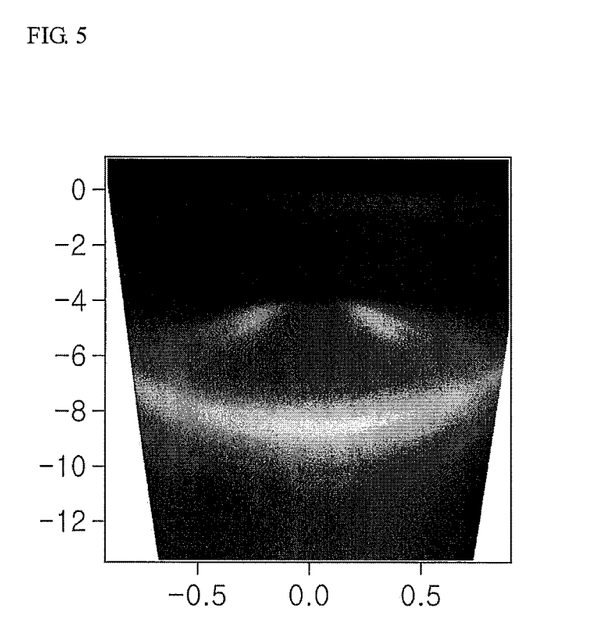
FIG. 5 is a band image of the graphene-coated steel sheet manufactured according to one exemplary embodiment of the present invention, as measured through angle-resolved photoelectron spectroscopy to determine whether a graphene layer grows well on a steel sheet.

FIG. 5 shows a band image of the test sample, as measured using an angle-resolved photoelectron spectrometer. As shown in FIG. 5, the graphene-coated steel sheets manufactured in Examples 1 and 2 were shown to have the same band images, and specific sigma (σ) and pi (π) bands of graphene were clearly observed. From these results, it could be seen that the graphene layer having a monocrystalline form was well formed on the surface of the steel sheet.

Experimental Example 4

To check the crystallinity of each graphene layer, the graphene-coated steel sheets manufactured in Examples 1 and 2 were measured for high-resolution photoelectron spectroscopy spectrum, as follows.

Each of the graphene-coated steel sheets manufactured in Examples 1 and 2 was cut into pieces having a size of 7.5 mm×7.5 mm (width×length). Then, the photoelectron spectroscopy spectra of each test sample with respect to graphene were measured using a high-resolution photoelectron spectrometer (HRPES). Thereafter, an FWHM of graphene on the 1S core level spectra of carbon (C) in graphene of each test sample was measured, as shown in FIG. 1.

The results obtained as described above by measuring the FWHM of graphene on the 1S core level spectra of carbon (C) in graphene of each test sample are listed in the following Table 1.

TABLE 1

| Items | Example 1 | Example 2 |
|---|---|---|
| FWHM (eV) | 0.58 | 0.58 |

As listed in Table 1, it was revealed that FWHMs of the graphene-coated steel sheets manufactured according to the present invention on the 1S core level spectra of carbon (C) in graphene were all 0.58 eV.

Also, it was confirmed that the FWHM on the 1S core level spectra of carbon (C) in graphene was controlled to a value of less than 0.8 eV in the case of the graphene-coated steel sheets manufactured using the method for manufacturing a graphene-coated steel sheet according to the present invention, indicating that a high-quality graphene layer having a mono crystalline form was formed on a surface of the steel sheet. This was because cleanliness and crystallinity of the surface of the steel sheet were very excellent.

Experimental Example 5

For the graphene-coated steel sheets manufactured in Examples 1 and 2, an average diameter of each graphene domain was measured, as follows.

Each of the graphene-coated steel sheets manufactured in Examples 1 and 2 was cut into pieces having a size of 7.5 mm×7.5 mm (width×length). Then, an average diameter of each graphene domain was measured using a scanning tunneling microscope (Aarhus 150 commercially available from SPECS Ltd.).

The results obtained as described above by measuring average diameters of the graphene domains present in each test sample are listed in the following Table 2.

TABLE 2

| Items | Example 1 | Example 2 |
|---|---|---|
| Average diameter (Å) of graphene domain | 500 | 500 |

Experimental Example 6

During manufacture of the graphene-coated steel sheets of Examples 1 and 2, contents of carbon (C) and sulfur (S) remaining on the washed steel sheet were measured, as follows.

After the contaminated steel sheets prepared in Examples 1 and 2 were washed and before a graphene layer was formed on each of the washed steel sheets, the contents of carbon (C) and sulfur (S) remaining on the washed steel sheet were measured using photoelectron spectroscopy.

The contents of carbon (C) and sulfur (S) remaining on the washed steel sheet as measured using the method are listed in the following Table 3.

TABLE 3

| Items | Example 1 | Example 2 |
|---|---|---|
| Content of carbon (C) included in single-layer graphene layer | 100 | 100 |
| Content of carbon (C) remaining on washed steel sheet | 13 | 13 |
| Content of sulfur (S) remaining on washed steel sheet | 4 | 4 |

Content units: parts by weight

Experimental Example 7

The graphene-coated steel sheets manufactured in Examples 1 and 2 were measured to determine whether each graphene domain had two dominant domain directions.

Figure 6:
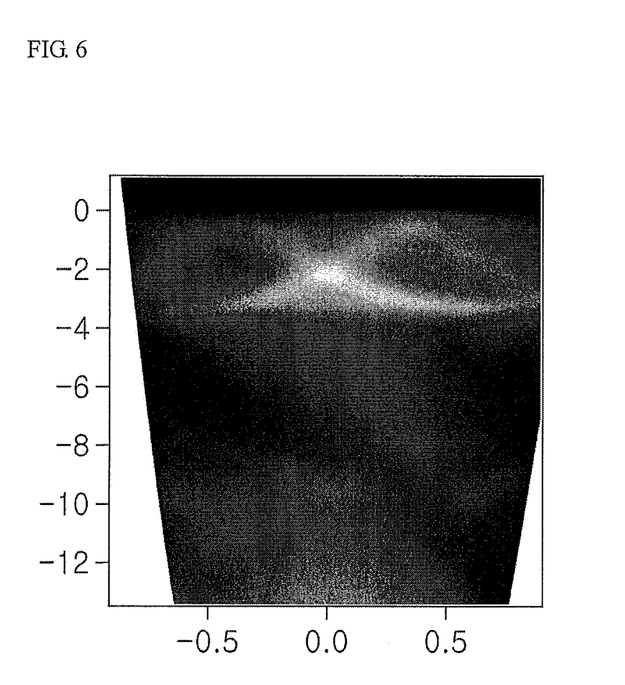
FIG. 6 is a band image of the graphene-coated steel sheet manufactured according to one exemplary embodiment of the present invention, as measured at a critical point (K point) through angle-resolved photoelectron spectroscopy to determine whether a graphene domain of the graphene layer has two dominant domain directions.

FIG. 6 is a band image of the graphene layer, as measured at a critical point (K point) through angle-resolved photoelectron spectroscopy. As shown in FIG. 6, it could be seen that two band images were formed for the graphene layer. This indicates that the graphene domain constituting the graphene layer has two dominant domain directions for graphene.

Experimental Example 8

To determine whether corrosion of iron was prevented by graphene, a ferroxyl test was performed on the graphene-coated steel sheets prepared in Examples 1 and 2 and the graphene-free steel sheet prepared in Comparative Example 1, as follows.

Figure 7:
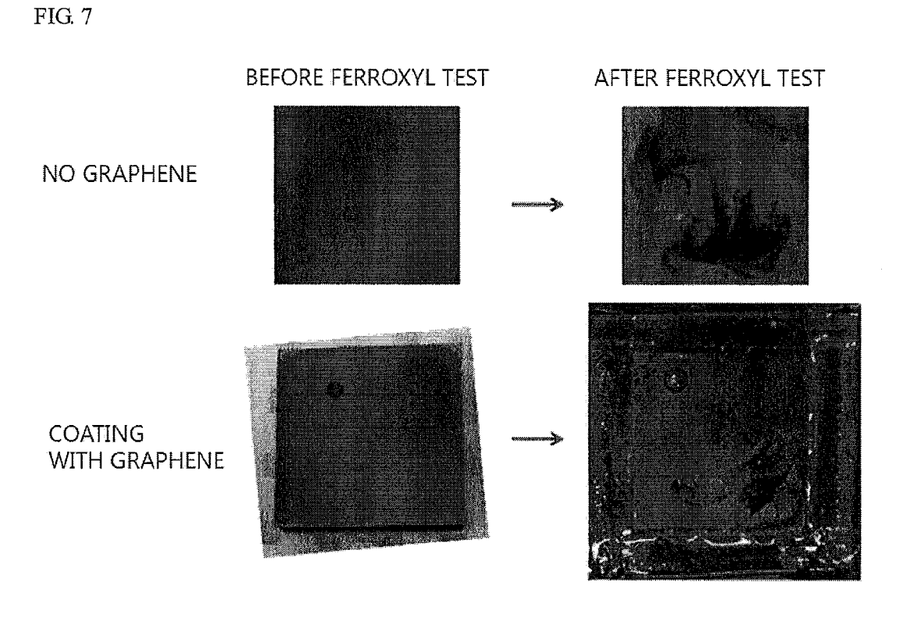
FIG. 7 is an image illustrating the ferroxyl test results performed on the graphene-coated steel sheet prepared according to one exemplary embodiment of the present invention and on a graphene-free steel sheet.

A ferroxyl test solution (a solution including potassium ferricyanide ($K_3Fe(CN)_6$)) was applied onto surfaces of the graphene-coated steel sheets prepared in Examples 1 and 2 and a surface of the graphene-free steel sheet prepared in Comparative Example 1 to observe a change in color. FIG. 7 is an image illustrating the ferroxyl test results. As shown in FIG. 7, it was revealed that, when iron was exposed from a surface of the steel sheet, the graphene-free steel sheet of Comparative Example 1 turned blue since ferrous iron ($Fe^{2+}$) was strongly bound to ferricyanide in the solution to form a complex (Prussian blue, $KFe^{3+}[Fe^{2+}](CN)_6$). However, it was revealed that, since a surface of the steel sheet was coated with graphene in the case of the graphene-coated steel sheets of Examples 1 and 2, such a complex was not formed, and thus there was no change in color.

Figure 8:
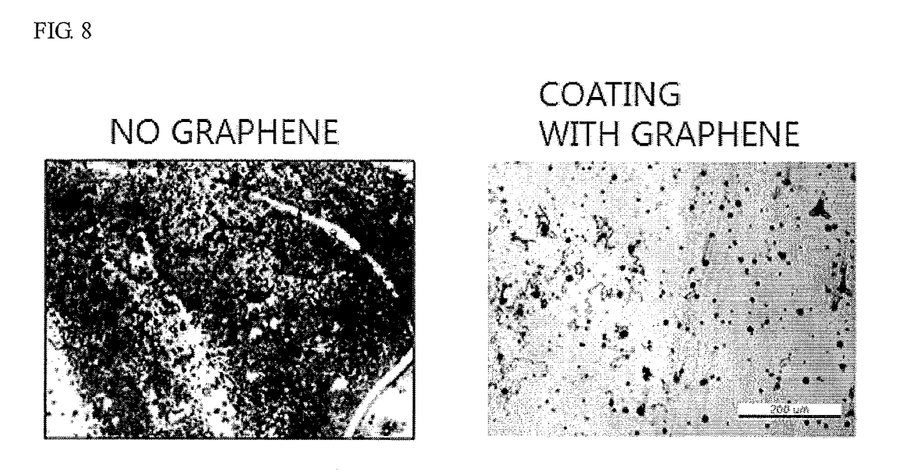
FIG. 8 is an optical microscope image illustrating the results of the ferroxyl test shown in FIG. 6.

FIG. 8 is an optical microscope image showing a change in color of the test sample. As described above, the graphene-coated steel sheets according to the present invention prepared in Examples 1 and 2 may improve an ability to prevent corrosion of iron by interfering with contact of the graphene layer with external environments since the graphene layer protects a surface of the steel sheet.

According to the present invention, a graphene-coated steel sheet, which can be useful in preventing corrosion of iron, such as oxidation of iron, has remarkably excellent thermal conductivity and electrical conductivity, and shows excellent heat resistance resulting from thermal stability of graphene, can be provided. According to the present invention, the method for manufacturing a graphene-coated steel sheet, which can be useful in manufacturing a high-quality graphene-coated steel sheet having a monocrystalline form and showing substantially no defects or impurities, can be also provided.

While the invention has been shown and described with reference to certain exemplary embodiments thereof, it will be understood by those skilled in the art that various changes in form and details may be made therein without departing from the spirit and scope of the invention as defined by the appended claims.

What is claimed is:

1. A graphene-coated steel sheet comprising:
    a steel sheet including carbon; and
    a graphene layer formed on the steel sheet,
    wherein a graphene domain of the graphene layer has an average diameter of 300 to 1000 Å, and
    the graphene-coated steel sheet satisfies the following Expression 1:

$$X \leq 0.8 \text{ eV}, \quad \text{Expression 1}$$

wherein X represents a full width at half maximum (FWHM) of graphene included in the steel sheet on the 1S core level spectra of carbon (C) as measured using a high-resolution photoelectron spectrometer (HRPES).

2. The graphene-coated steel sheet of claim 1, wherein X is 0.2 eV to 0.8 eV.

3. The graphene-coated steel sheet of claim 1, wherein a graphene domain of the graphene layer has two dominant domain directions.

4. The graphene-coated steel sheet of claim 1, wherein the graphene layer is formed in a single-layer or multilayered structure.

5. The graphene-coated steel sheet of claim 4, wherein the multilayered structure is composed of 2 to 10 layers.

6. The graphene-coated steel sheet of claim 1, wherein a graphene domain of the graphene layer is a monocrystalline or polycrystalline form.

7. The graphene-coated steel sheet of claim 1, wherein carbon (C) remaining in an intermediate layer at an interface between the steel sheet and the graphene layer is present at a content of 15 parts by weight or less, based on 100 parts by weight of the carbon included in a single graphene layer.

8. The graphene-coated steel sheet of claim 1, wherein sulfur (S) remaining in an interface between the steel sheet and the graphene layer is present at a content of 4 parts by weight or less, based on 100 parts by weight of the carbon included in a single graphene layer.

9. A method for manufacturing a graphene-coated steel sheet, comprising:
    washing a surface of a steel sheet including carbon in a vacuum container with inert gas ions by repeatedly performing inert gas ion sputtering and electron beam heating on the surface of the steel sheet; and
    forming a graphene layer on the steel sheet by heating the washed steel sheet at a temperature in a range of 400° C. to 1100° C. and injecting hydrocarbon into the vacuum container to dissociatively absorb the hydrocarbon onto the steel sheet by crystallizing the carbon,
    wherein a graphene domain of the graphene layer has an average diameter of 300 to 1000 Å.

10. The method of claim 9, wherein a pressure in the vacuum container in the washing of the surface of the steel sheet is in a range of $10^{-5}$ Pa to $10^{-2}$ Pa.

11. The method of claim 9, wherein repeated inert gas ion sputtering and electron beam heating on the surface of the steel sheet is performed 10 to 200 times.

12. The method of claim 9, wherein carbon (C) remaining on a surface of the washed steel sheet is present at a content of 15 parts by weight or less, based on 100 parts by weight of the carbon included in a single graphene layer.

13. The method of claim 9, wherein sulfur (S) remaining on a surface of the washed steel sheet is present at a content of 4 parts by weight or less, based on 100 parts by weight of the carbon included in a single graphene layer.

14. The method of claim 9, wherein a heating temperature of the washed steel sheet is in a range of 500° C. to 900° C.

15. The method of claim 9, wherein the hydrocarbon is injected at an amount of 10 Langmuirs or more.

16. The method of claim 9, wherein the hydrocarbon is an alkyne-based hydrocarbon, an alkene-based hydrocarbon, or an alkane-based hydrocarbon.

17. A method for manufacturing a graphene-coated steel sheet, comprising:
    washing a surface of a steel sheet including carbon in a vacuum container with inert gas ions by repeatedly performing inert gas ion sputtering and electron beam heating on the surface of the steel sheet; and
    forming a graphene layer on the steel sheet by heating the washed steel sheet at a temperature in a range of 400° C. to 1100° C. to separate carbon included in the steel sheet by crystallizing the carbon,
    wherein a graphene domain of the graphene layer has an average diameter of 300 to 1000 Å.

18. The method of claim 17, wherein a pressure in the vacuum container in the washing of the surface of the steel sheet is in a range of $10^{-5}$ Pa to $10^{-2}$ Pa.

19. The method of claim 17, wherein repeated inert gas ion sputtering and electron beam heating on the surface of the steel sheet is performed 10 to 200 times.

20. The method of claim 17, wherein carbon (C) remaining on a surface of the washed steel sheet is present at a content of 15 parts by weight or less, based on 100 parts by weight of the carbon included in a single graphene layer.

21. The method of claim 17, wherein sulfur (S) remaining on a surface of the washed steel sheet is present at a content of 4 parts by weight or less, based on 100 parts by weight of the carbon included in a single graphene layer.

22. The method of claim 17, wherein a heating temperature of the washed steel sheet is in a range of 500° C. to 900° C.

* * * * *